(12) United States Patent
Chen

(10) Patent No.: US 7,294,892 B2
(45) Date of Patent: Nov. 13, 2007

(54) MULTI-TRANSISTOR LAYOUT CAPABLE OF SAVING AREA

(75) Inventor: Hsin-Hung Chen, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/908,827

(22) Filed: May 27, 2005

(65) Prior Publication Data

US 2006/0267110 A1 Nov. 30, 2006

(51) Int. Cl.
- *H01L 23/62* (2006.01)
- *H01L 29/76* (2006.01)
- *H01L 29/94* (2006.01)
- *H01L 31/062* (2006.01)
- *H01L 31/113* (2006.01)

(52) U.S. Cl. .................. 257/401; 257/173; 257/355; 257/356; 257/360

(58) Field of Classification Search ............. 257/331, 257/341, 343, 355, 356, 357, 360, 368, 369, 257/401, 173
See application file for complete search history.

(56) References Cited

U.S. PATENT DOCUMENTS

| | | | | |
|---|---|---|---|---|
| 4,546,453 A | * | 10/1985 | Noufer | 365/104 |
| 6,477,023 B1 | * | 11/2002 | Tang et al. | 361/56 |
| 6,798,022 B1 | * | 9/2004 | Kuroda et al. | 257/360 |

* cited by examiner

*Primary Examiner*—Monica Lewis
(74) *Attorney, Agent, or Firm*—Winston Hsu

(57) ABSTRACT

A multi-transistor layout capable of saving area includes a substrate; a common drain comprising four sides formed over the substrate; four gates formed over the four sides of the common drain; and four sources formed over outer sides of the four gates corresponding to the common drain.

5 Claims, 13 Drawing Sheets

MULTI-TRANSISTOR LAYOUT CAPABLE OF SAVING AREA

BACKGROUND OF INVENTION

1. Field of the Invention

The present invention provides a multi-transistor layout capable of saving area, and more particularly, a multi-transistor layout with common drains.

2. Description of the Prior Art

As manufacturing processes of VLSI (very large scale integrated) circuits improves, operating frequencies of microprocessors, wireless communication units, etc. become higher and higher. In order to meet such high-frequency demand, improved efficiency of digital to analog converts, or DACs, is expected. In the prior art, a current-steering DAC is a high-speed DAC, whose signal current is switched to different outputs through switch gates.

Please refer to FIG. 1, which illustrates a schematic diagram of a prior art current-steering DAC 10. The current-steering DAC 10 includes common-source differential pairs $S_1$, $S_2$ to $S_N$ and corresponding current sources $I_1$, $I_2$ to $I_N$. Each of the common-source differential pairs $S_1$, $S_2$ to $S_N$ includes two PMOS transistors ($M_{1^+}$, $M_{1^-}$, $M_{2^+}$, $M_{2^-}$ to $M_{N^+}$ and $M_{N^-}$ shown in FIG. 1) for forming a switch of a differential pair. According to control signals $V_{C1^+}$, $V_{C1^-}$, $V_{C2^+}$, $V_{C2^-}$ to $V_{CN^+}$ and $V_{CN^-}$, the common-source differential pairs $S_1$, $S_2$ to $S_N$ utputs differential signals $D_{1^+}$, $D_{1^-}$, $D_{2^+}$, $D_{2^-}$ to $D_{N^+}$ and $D_{N^-}$ to resistors $R_{L1}$ and $R_{L2}$ outside the current-steering DAC 10. As shown in FIG. 1, combinations of the transistors $M_{1^+}$ and $M_{1^-}$, $M_{2^+}$ and $M_{2^-}$, . . . , and $M_{N^+}$ and $M_{N^-}$ are common-drain structures, so the current-steering DAC 10 is a circuit with common drains but without common sources and common gates.

As to a layout of the current-steering DAC 10, please refer to FIG. 2, which illustrates a schematic diagram of a prior art multi-transistor layout 20. The multi-transistor layout 20 includes drains 220 and 222, a source 24, and gates 260 and 262. The source 25 includes three contacts. Each of the drains 220 and 222 includes two contacts, and each of the gates 260 and 262 includes one contact. In order to conform to an electrostatic discharge (ESD) rule, manufactories set a minimum width of the drains. For example, if the minimum acceptable width of each of the drains 220 and 222 is 4 μm and areas of the contacts on the drains 220 and 222 are considered, a minimum area of each drain in the multi-transistor layout 20 is 22.7 μm² (=4.45 μm×5.1 μm).

Please refer to FIG. 3, which illustrates a schematic diagram of a prior art multi-transistor layout 30. The multi-transistor layout 30 includes drains 320, 322, sources 340, 342, 344, and gates 360, 362, 364, 366. The drains 320, 322, the sources 340, 342, 344, and the gates 360, 362, 364, 366 can include a plurality of contacts. In FIG. 3, each of the drains 320 and 322 includes two contacts, each of the sources 340, 342, and 344 includes three contacts, and each of the gates 360, 362, 364, and 366 includes one contact. In the multi-transistor layout 20 in FIG. 2, a minimum acceptable width of each of the drains 320 and 322 is 4 μm, so a minimum area of each of the drains in the multi-transistor layout 30 is 11.73 μm² (=4.6 μm×5.1 μm×0.5, where "0.5" means that two transistors share a drain). In comparison, for the same ESD rule, the area of each drain in the multi-transistor layout 30 is 51.7% of that of the multi-transistor layout 20.

As manufacturing processes of semiconductors progress, ESD protection becomes more and more important. For those transistors with drains connecting to pins of a chip, layouts of the drains must conform to a specific rule. Therefore, in an output end of a current-steering DAC, a drain of a transistor switch occupies a large area, induces parasitic capacitance, increases reaction time of the current-steering DAC, and decreases efficiency. In order to reduce areas of drains in a transistor having wide gates, the prior art applies layouts with finger-like, waffle-like, and n-sided polygonal shapes to layout the transistors. Please refer to FIGS. 4, 5, and 6, which illustrate schematic diagrams of finger-like, waffle-like, and n-sided polygonal layouts. In FIGS. 4, 5, and 6, notations G, D, and S represent layouts of gates, drains, and sources. As shown in FIGS. 4, 5, and 6, the finger-like, the waffle-like, and the n-sided polygonal layouts can reduce areas of the drains, but they cannot be applied for circuits with common drains but without common sources, such as the current-steering DAC 10.

SUMMARY OF INVENTION

It is therefore a primary objective of the claimed invention to provide multi-transistor layouts capable of saving area.

The present invention discloses a multi-transistor layout capable of saving area, which includes a substrate; a common drain comprising four sides formed over the substrate; four gates formed over the four sides of the common drain; and four sources formed over outer sides of the four gates corresponding to the common drain.

The present invention further discloses a multi-transistor layout capable of saving area, which includes: a substrate; a first common drain comprising four sides formed over the substrate; a second common drain comprising four sides formed over the substrate; three first gates formed over three of the four sides of the first common drain; three first sources formed over outer sides of the three first gates corresponding to the first common drain; three second gates formed over three of the four sides of the second common drain; three second sources formed over outer sides of the three second gates corresponding to the second common drain; a third gate formed over the side of the first common drain that does not have a first gate; a fourth gate formed over the side of the second common drain that does not have a second gate; and a common source formed between the third gate and the fourth gate.

The present invention further discloses a multi-transistor layout capable of saving area, which includes: a substrate; a common drain array on the substrate comprising a plurality of common drains, each comprising four sides; a plurality of gates formed over four sides of each common drain of the plurality of the common drains; and a plurality of common sources formed between adjacent gates of the plurality of the gates.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
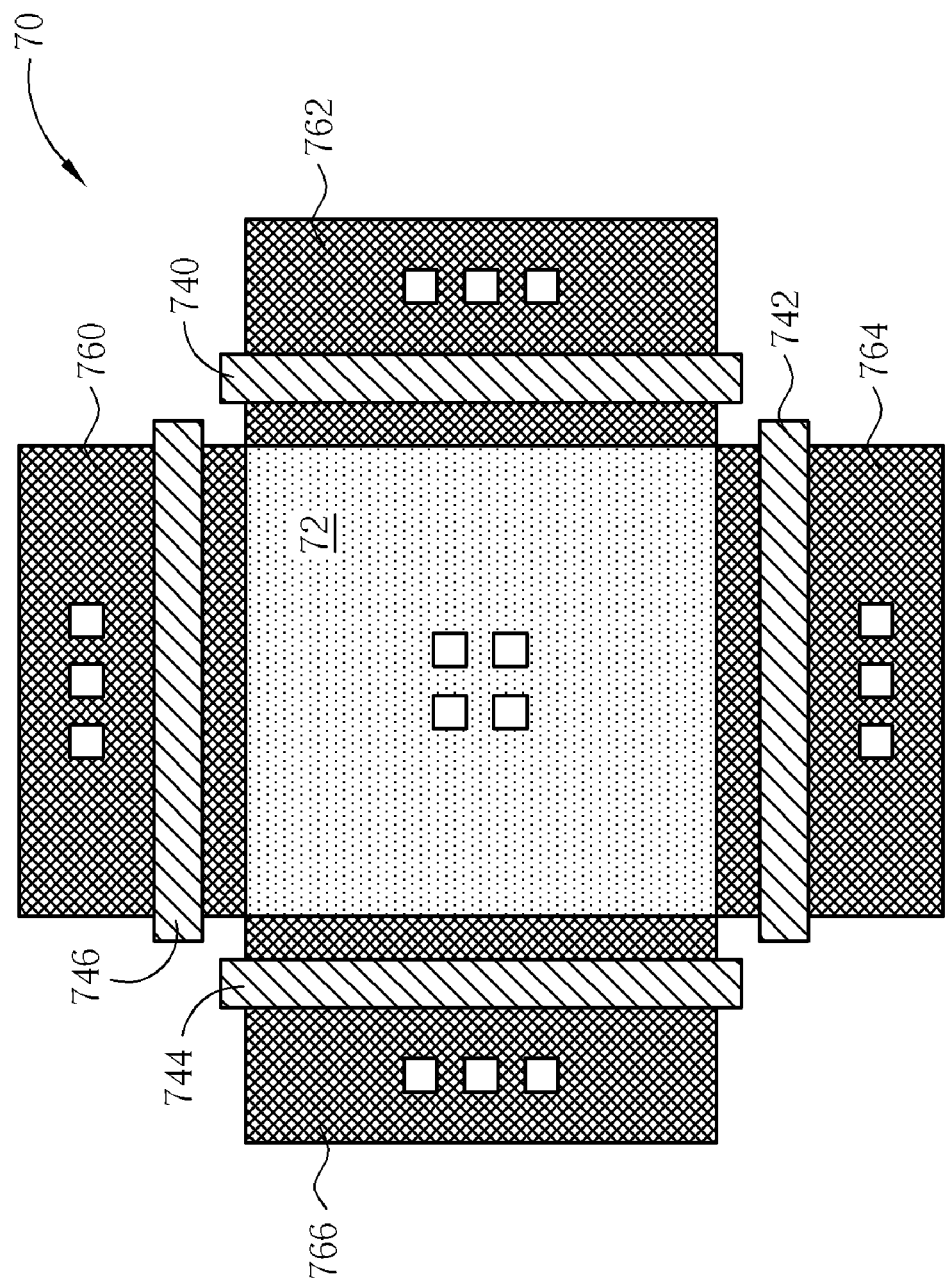
FIG. 7 illustrates a schematic diagram of a multi-transistor layout in accordance with the present invention.

Please refer to FIG. 7, which illustrates a schematic diagram of a multi-transistor layout 70 in accordance with the present invention. The multi-transistor layout 70 includes a common drain 72, gates 740, 742, 744, 746, and sources 760, 762, 764, 766. The common drain 72 includes four contacts, each of the gates 740, 742, 744, and 746 includes one contact, and each of the sources 760, 762, 764, and 766 includes three contacts. If a minimum acceptable width of a drain is 4 µm and areas of the contacts on the common drain 72 are considered, a drain of a transistor in the multi-transistor layout 70 occupies an area of 7.02 µm² (=5.3 µm×5.3 µm×0.25, where "0.25" means that four transistors share one drain). Therefore, the area of each drain in the present invention multi-transistor layout 70 is 31% of that in the multi-transistor layout 30. That is, for the same ESD rule, in a fixed area, the present invention multi-transistor layout 70 can save area and can be applied for a circuit with a common drain but without any common sources and common gates, such as a current-steering DAC.

Figure 8:
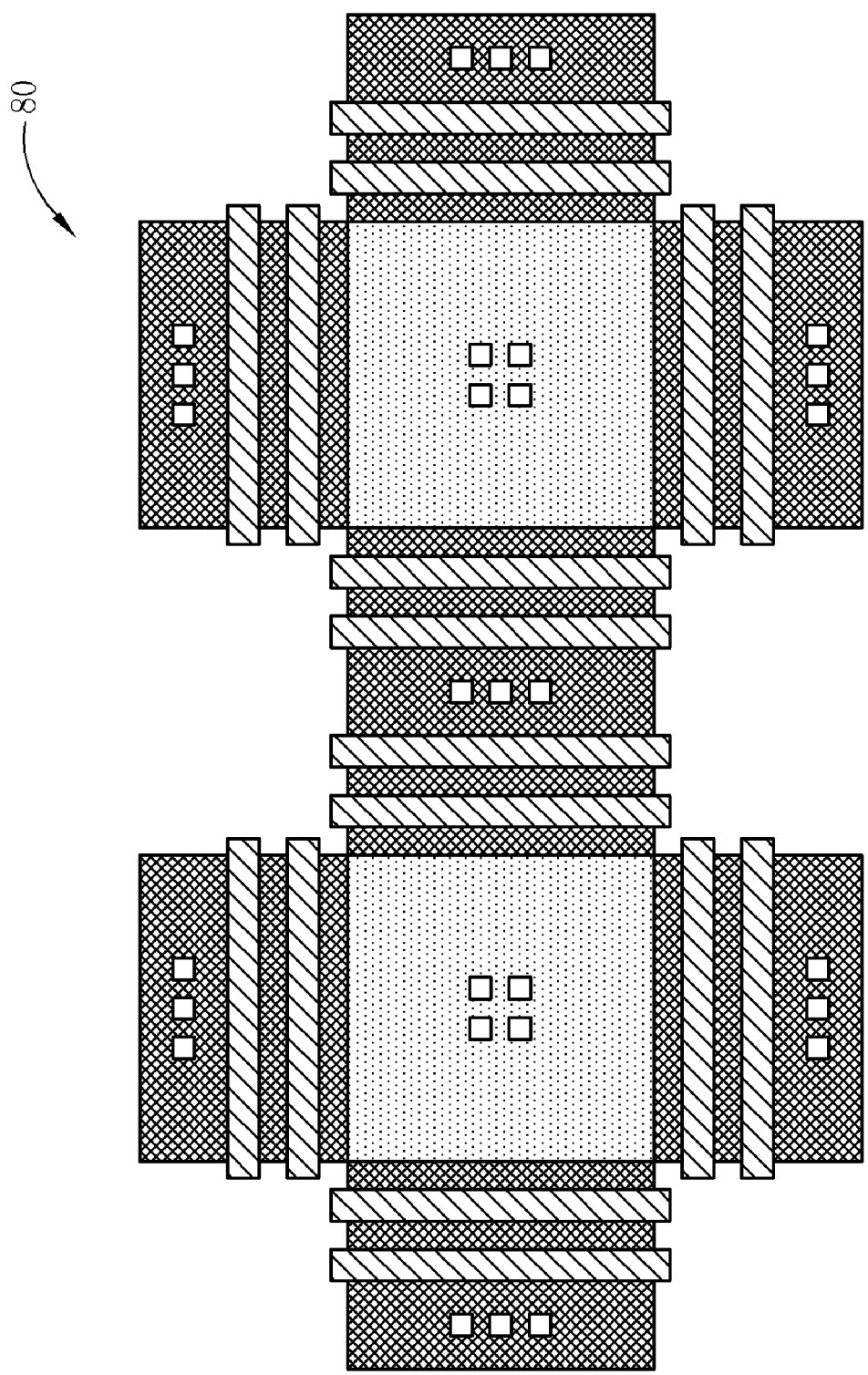
FIG. 8 illustrates a schematic diagram of an embodiment multi-transistor layout in accordance with the present invention.
Figure 9:
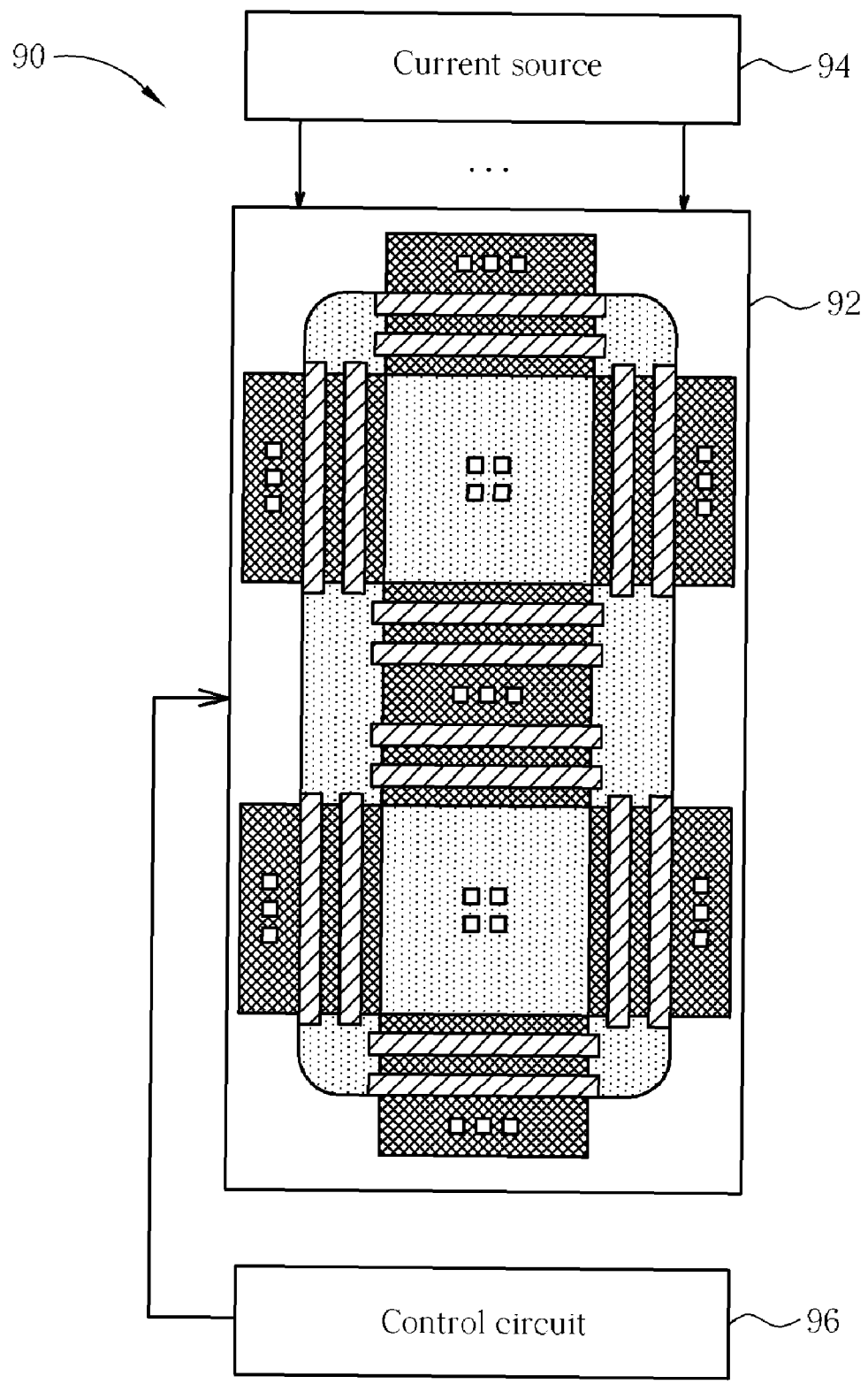
FIG. 9 illustrates a schematic diagram of a switch circuit.
Figure 13:
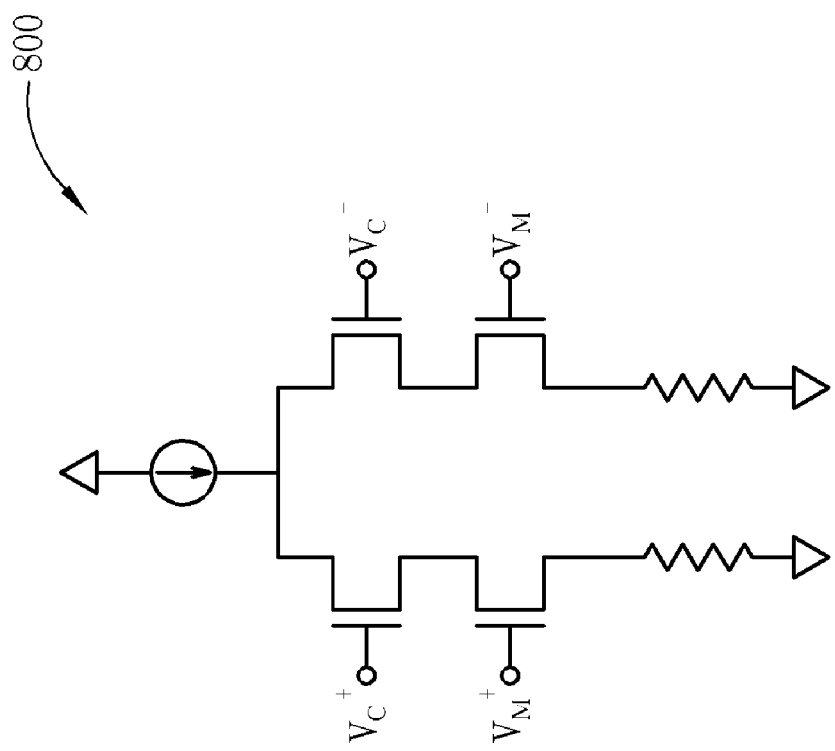
FIG. 13 illustrates a schematic diagram of a prior art DAC.

Furthermore, for extending the present invention appropriately, other multi-transistor layouts can be derived. Please refer to FIG. 13 and FIG. 8, FIG. 13 illustrates a schematic diagram of a prior art DAC 800, and FIG. 8 illustrates a schematic diagram of an embodiment multi-transistor layout 80 corresponding to switches of the DAC 800 in accordance with the present invention. The DAC 800 transforms digital data into analog data according to control signals $V_{C^+}$, $V_{C^-}$, $V_{CM^+}$, and $V_{CM^-}$, while the multi-transistor layout 80 is a layout combining two multi-transistor layouts 70 (shown in FIG. 7) according to the DAC 800, so that the multi-transistor layout 80 is a layout with common drains and a common source. As mentioned above, in order to conform to the ESD rule, a minimum width of the drains in the multi-transistor layout 80 is regulated. Under the ESD rule, the present invention multi-transistor layout 80 combines the common drains and the common source, which can be utilized for switch circuits, such as power switches or signal switches. For example, please refer to FIG. 9, which illustrates a schematic diagram of a switch circuit 90. The switch circuit 90 is formed by the multi-transistor layout 80, and includes a multi-transistor switch 92 with common drains and a common source, a current source 94, and a control circuit 96. The multi-transistor switch 92 is supplied by the current source 94, and outputs power or signals according to control signals provided by the control circuit 96.

Figure 1:
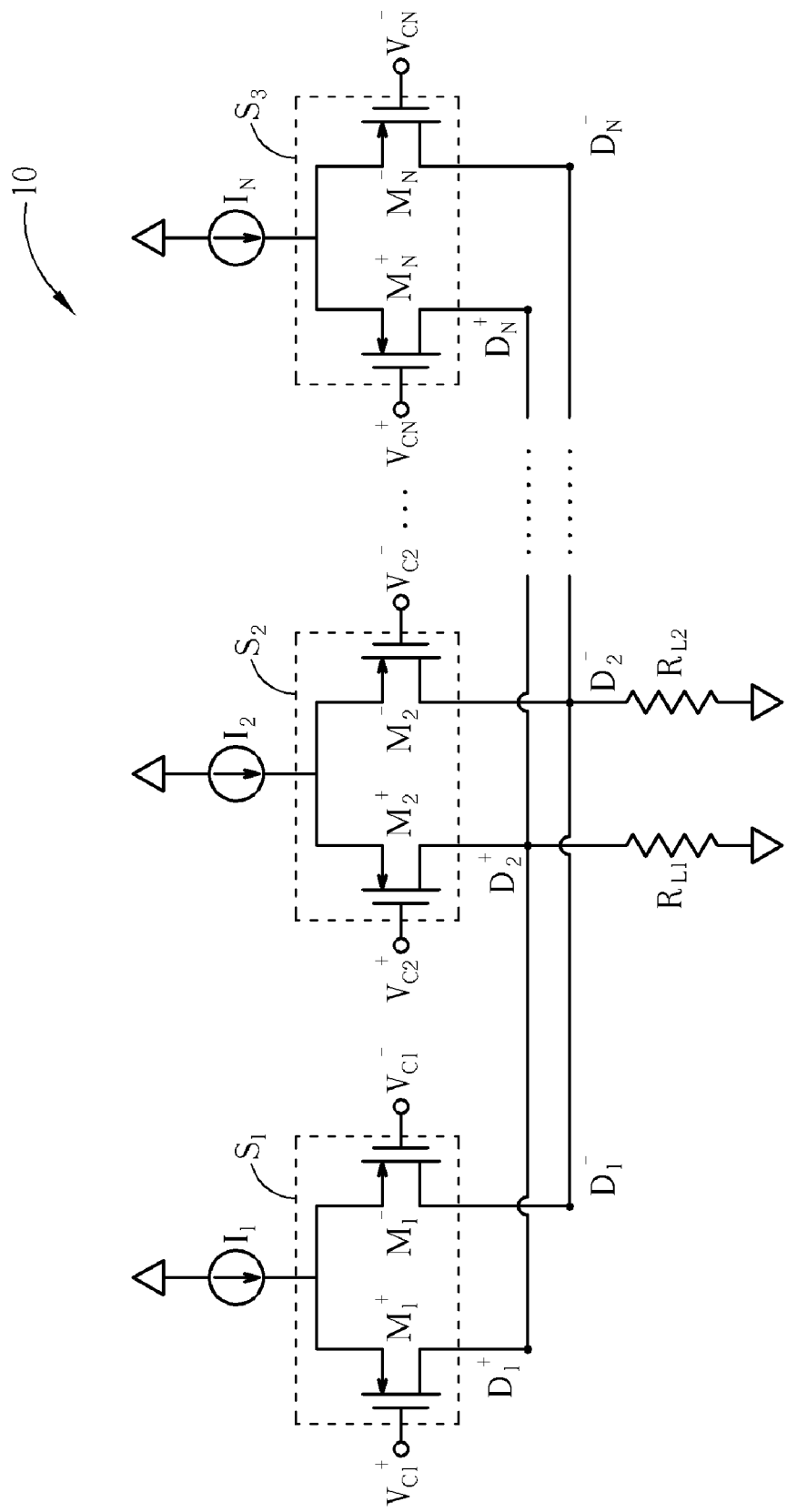
FIG. 1 illustrates a schematic diagram of a prior art current-steering DAC
Figure 2:
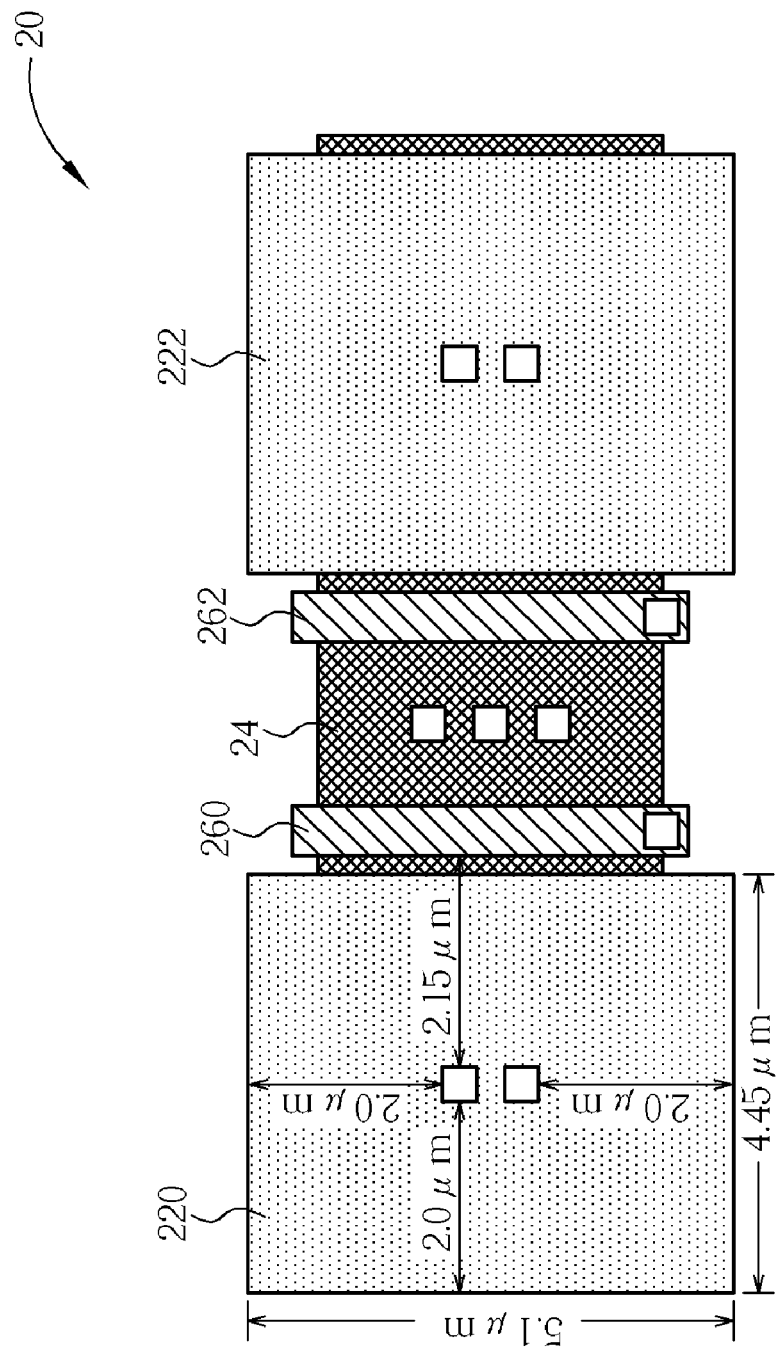
FIG. 2 and FIG. 3 illustrate schematic diagrams of prior art multi-transistor layouts.
Figure 3:
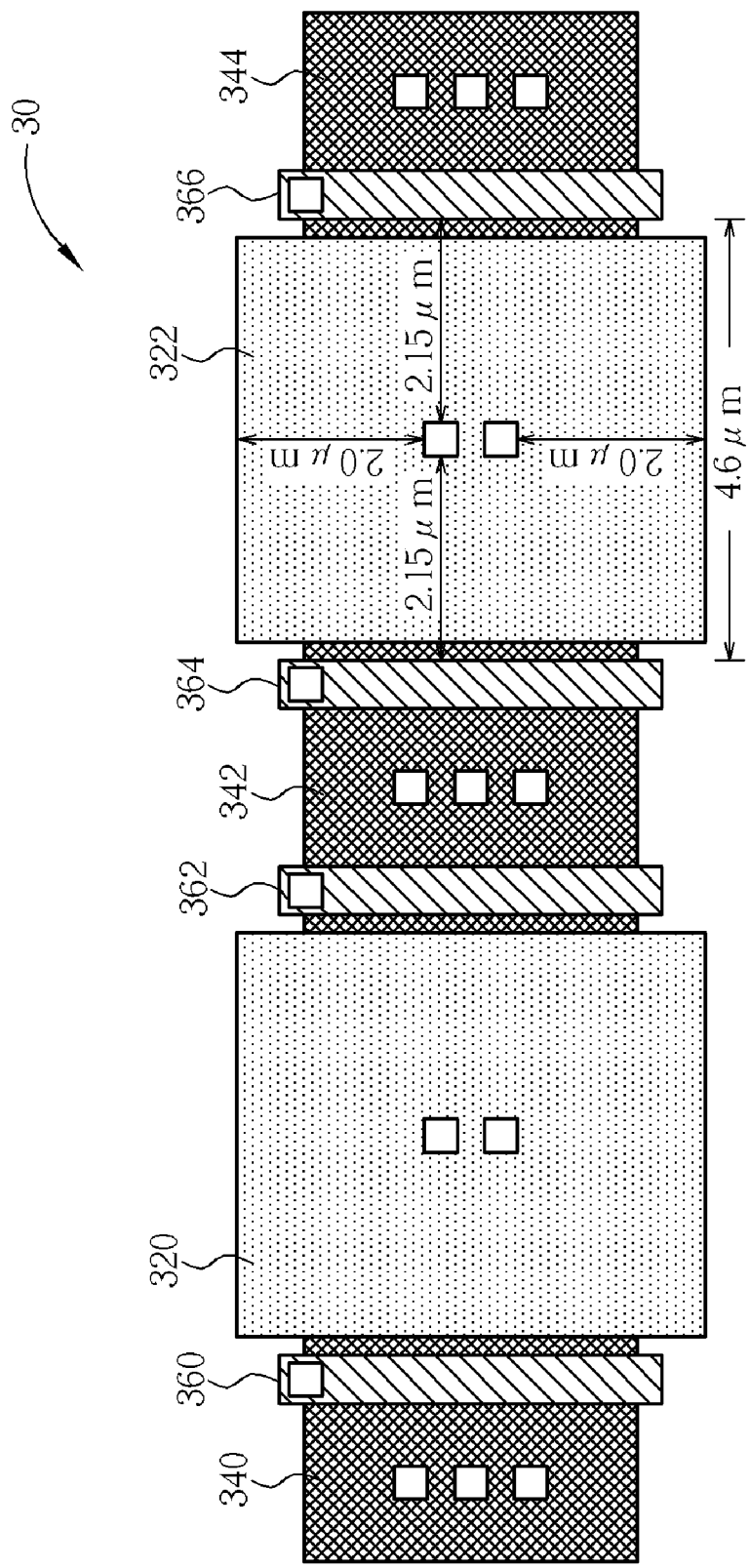
Figure 4:
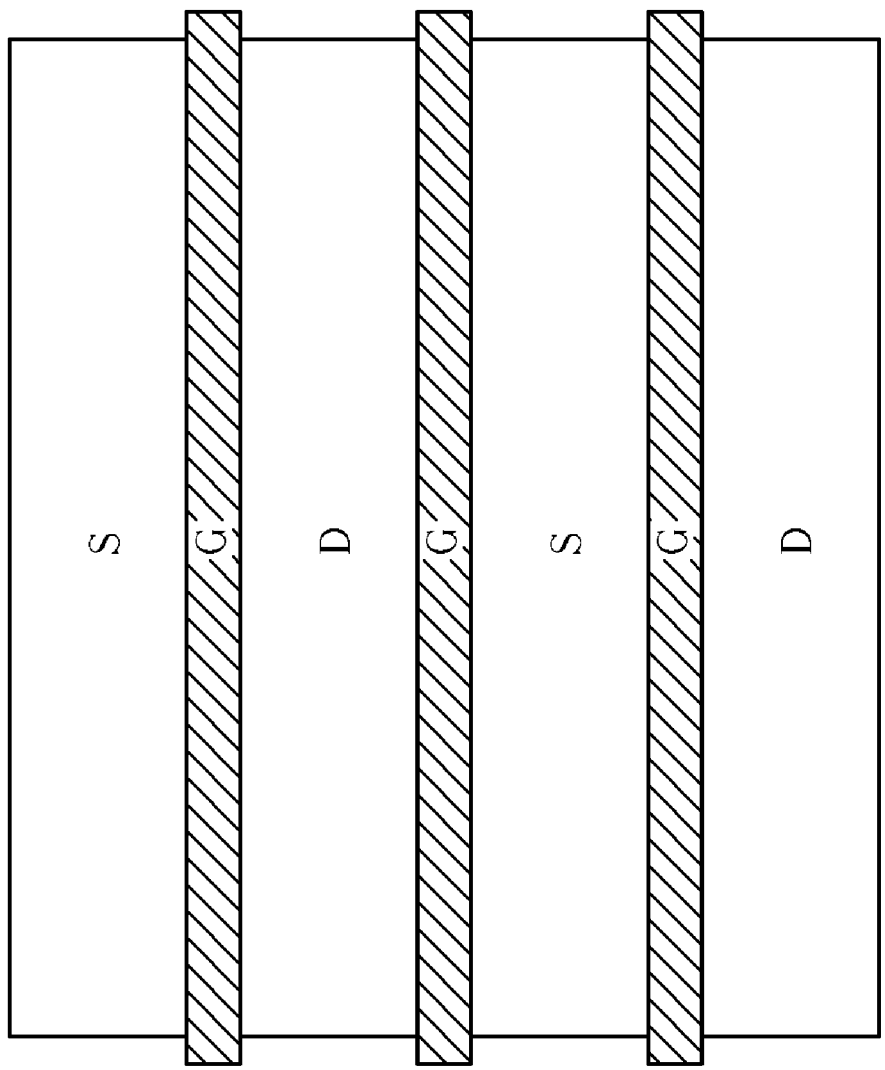
FIG. 4 illustrates a schematic diagram of a finger-like layout.
Figure 5:
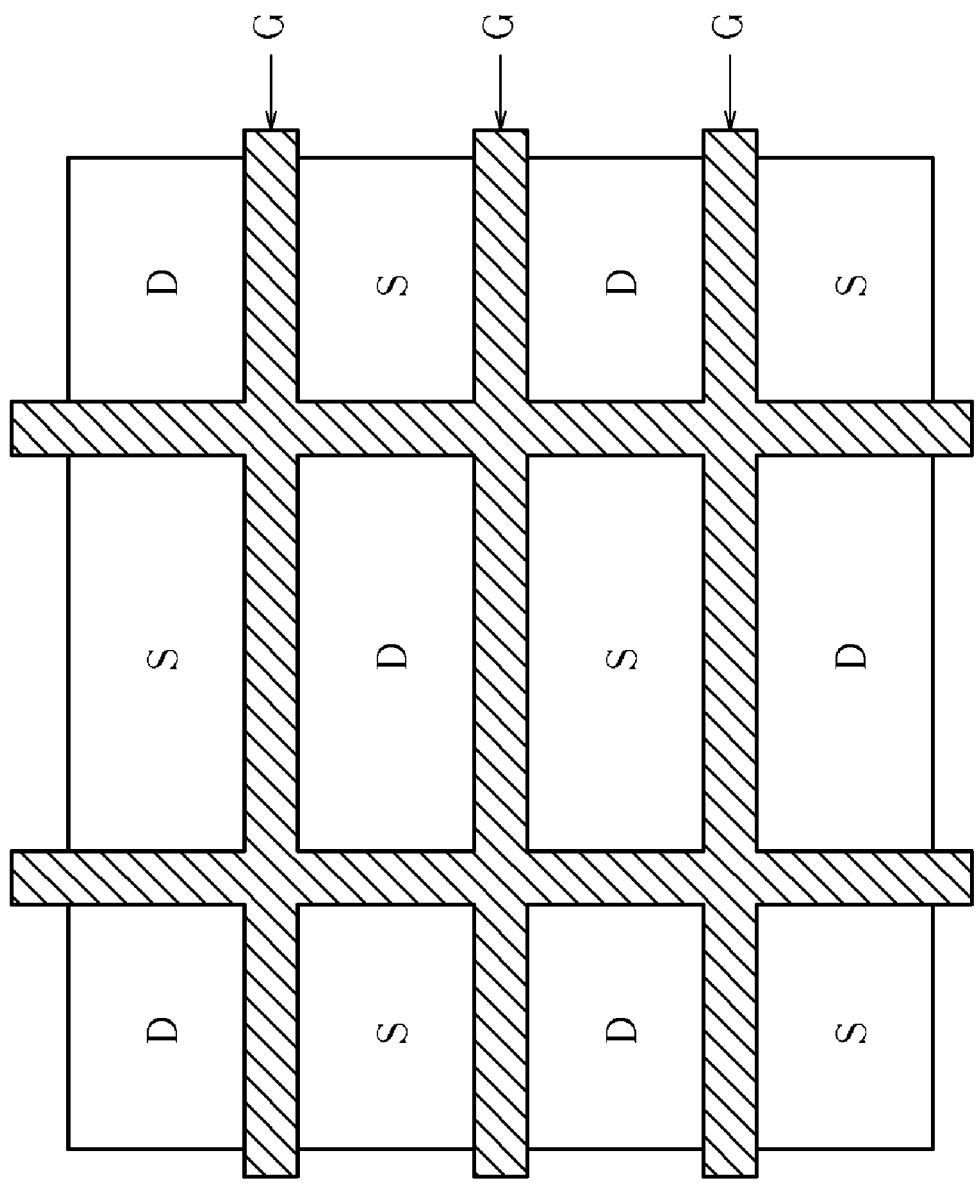
FIG. 5 illustrates a schematic diagram of a waffle-like layout.
Figure 6:
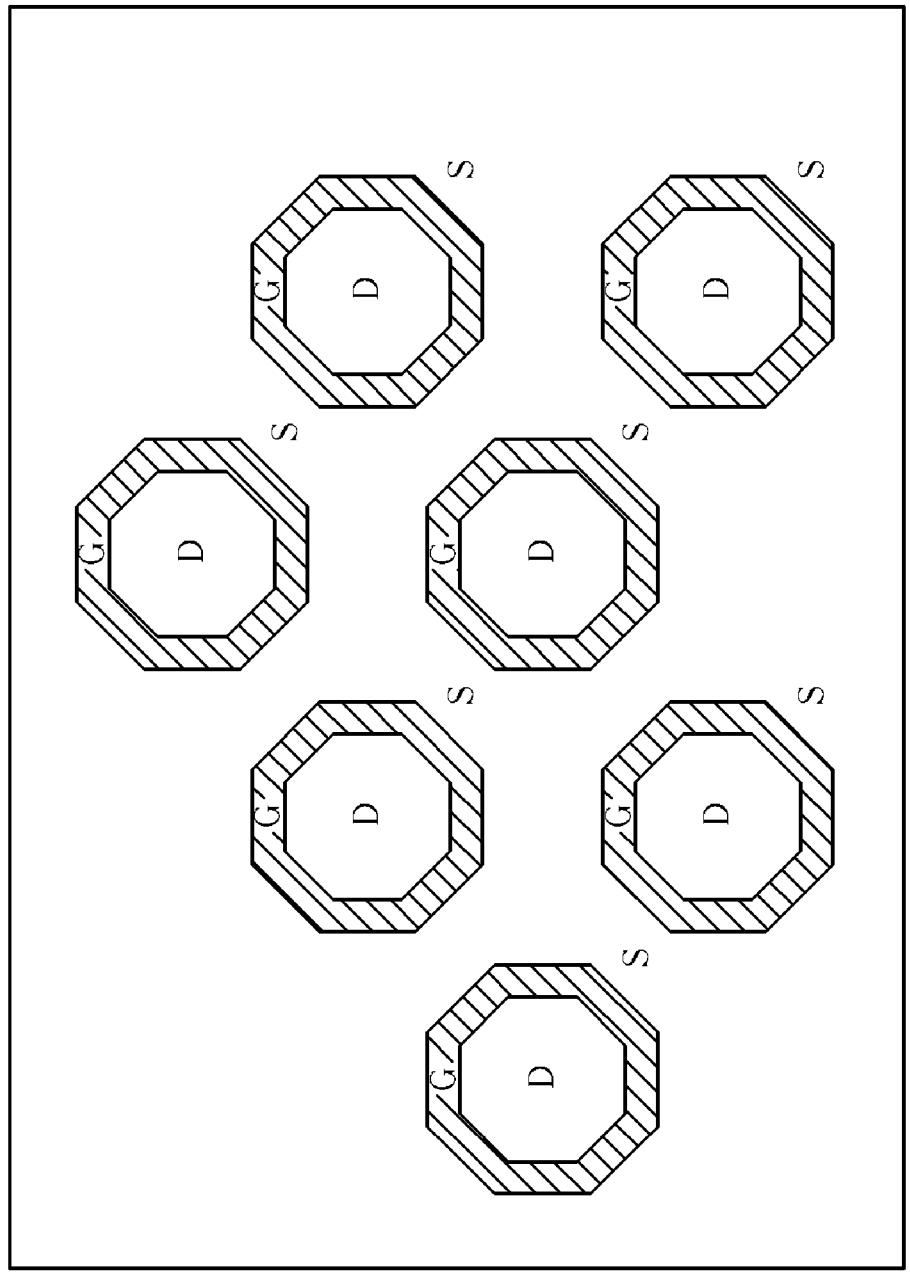
FIG. 6 illustrates a schematic diagram of an n-sided polygonal layout.
Figure 10:
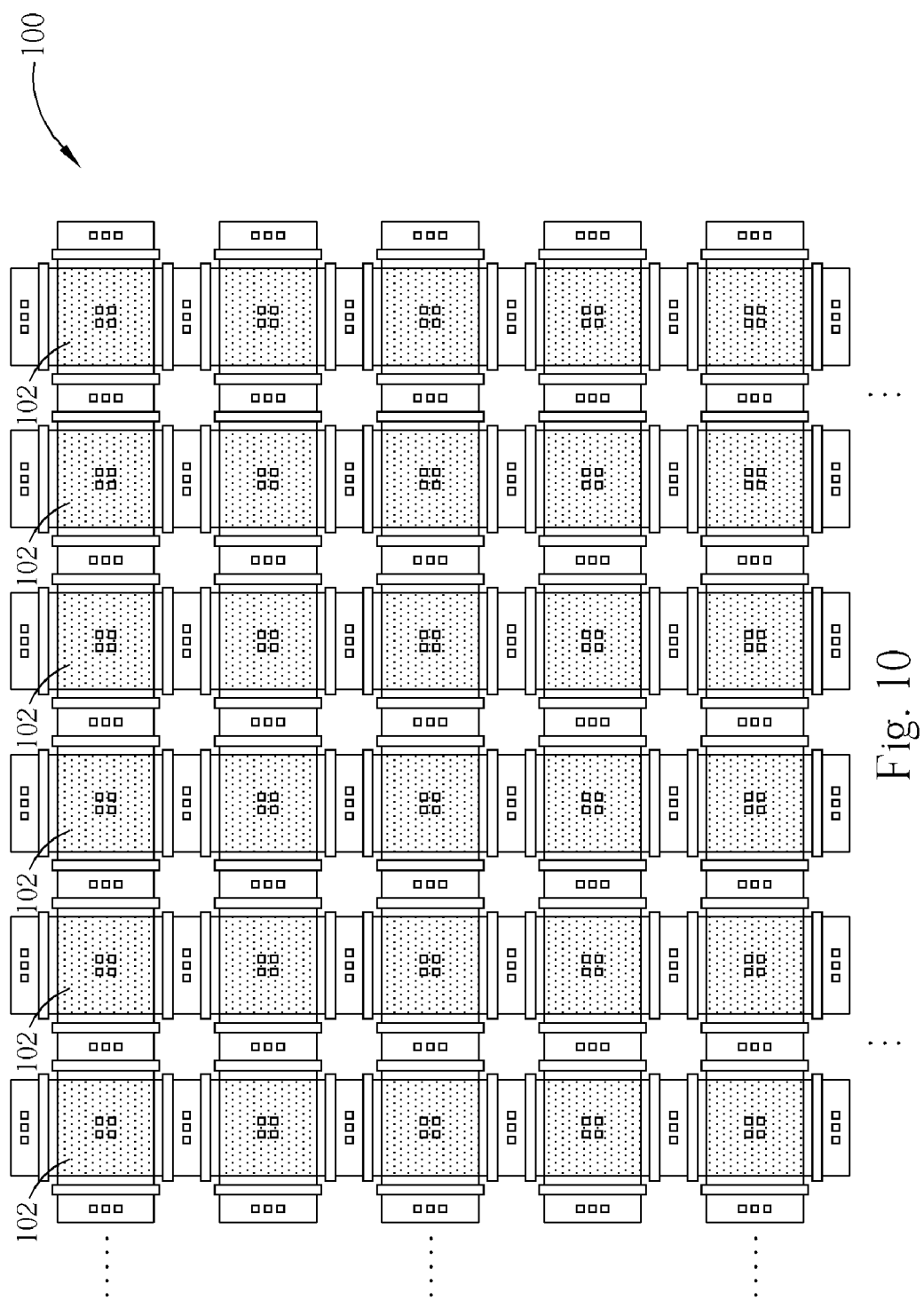
FIG. 10 illustrates a schematic diagram of a multi-transistor layout having a plurality of common drains and common sources.
Figure 11:
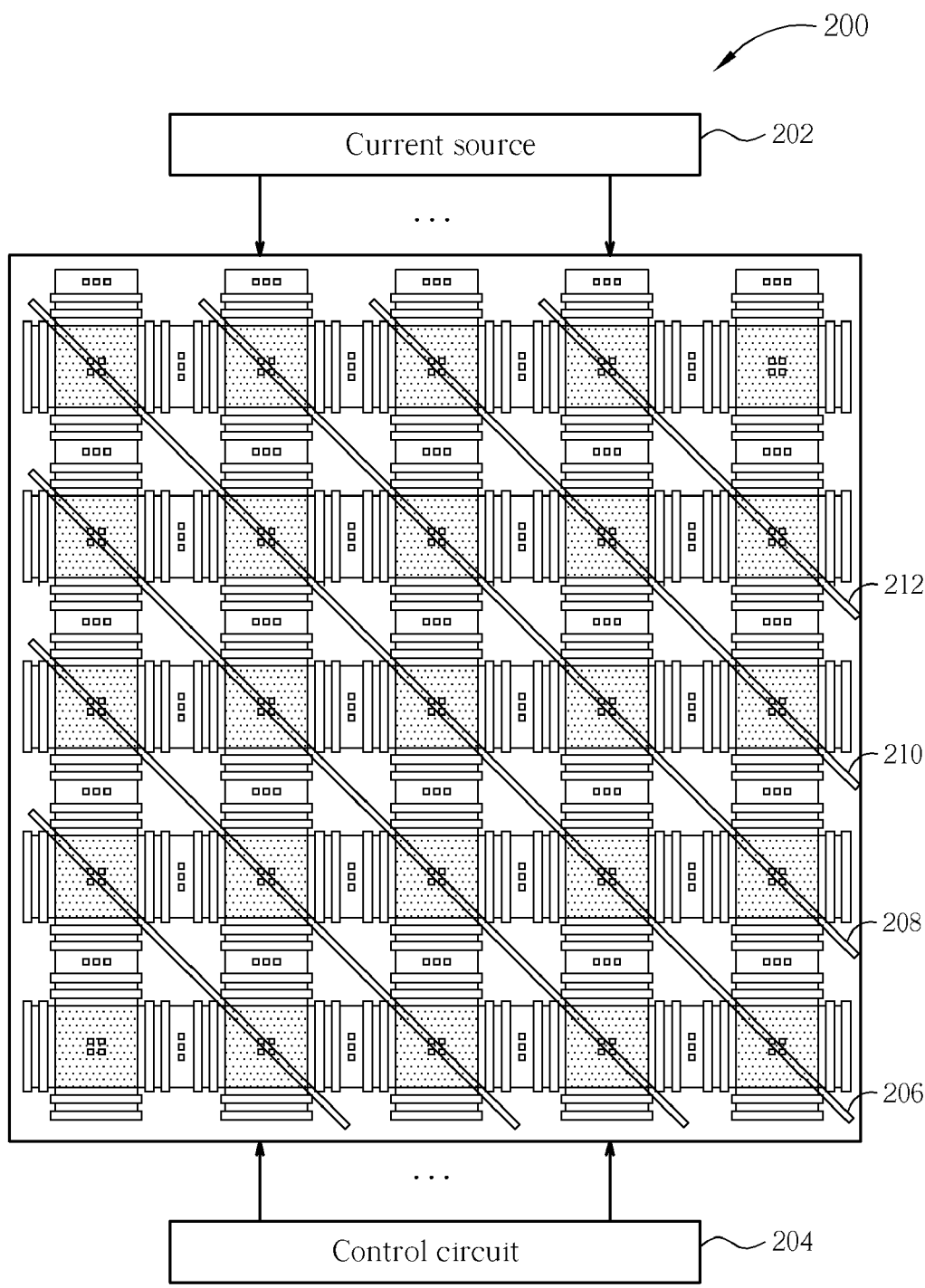
FIG. 11 and FIG. 12 illustrate schematic diagrams of switch arrays.

Furthermore, please refer to FIG. 10, which illustrates a schematic diagram of a multi-transistor layout 100 having a plurality of common drains and common sources. The multi-transistor layout 100 includes a common drain array formed by a plurality of common drains 102. Around each of the common drains 102 are corresponding gates, while between adjacent gates is a common source. Therefore, comparing to the finger-like, the waffle-like, and the n-sided polygonal layouts in FIGS. 4, 5, and 6, the present invention can increase a utility rate of available areas. Please refer to FIG. 11, which illustrates a schematic diagram of a switch array 200. The switch array 200 is formed by the multi-transistor layout 100, and couples the common drains in each diagonal line of the multi-transistor layout 100 with wires 206, 208, 210, 212, etc. In addition, a current source 202 provides current for operating the switch array 200, and a control circuit 204 outputs control signals for controlling the switch array 200.

Figure 12:
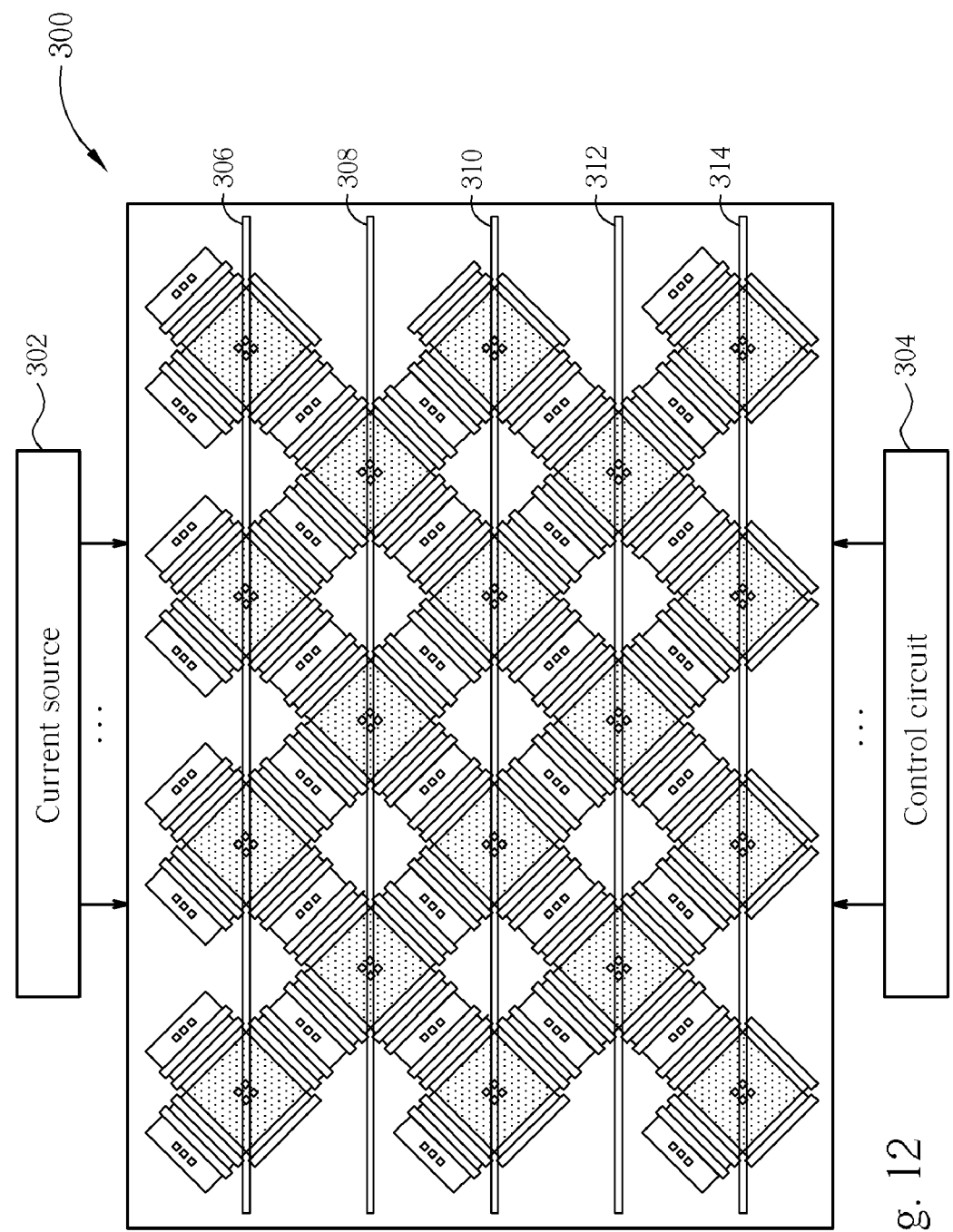

To ease the interconnection between switch array 200, 302 and 304, the multi-transistor layout in the switch array 200 is rotated by 45°. Please refer to FIG. 12, which illustrates a schematic diagram of a switch array 300. In the switch array 200 in FIG. 11, the switch array 300 couples common drains in each horizontal line in FIG. 12 with wires 306, 308, 310, 312, and 314, a current source 302 provides current for the switch array 300, and a control circuit 304 controls the switch array 300.

In summary, the present invention increases a utility rate of areas in a semiconductor layout, and decreases production cost and system resources, especially for circuits with common drains but without common sources and common gates, such as a current-steering DAC. Moreover, the present invention can decrease areas of drains, so as to decrease parasitic capacitance and reaction time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-transistor layout capable of saving area comprising:
   a substrate;
   a common drain comprising four sides formed over the substrate;
   four separate gates formed over the four sides of the common drain, wherein each gate is formed over a respective side of the common drain and the length of at least one gate is greater than the length of the respective side of the common drain; and
   four sources formed over outer sides of the four gates corresponding to the common drain,
   wherein the multi-transistor layout forms at least four transistors, and each transistor is formed from the common drain, one of the gates, and one of the sources that is formed on the outer side of the gate.

2. The multi-transistor layout of claim 1 further comprising a plurality of metal contacts on the common drain.

3. The multi-transistor layout of claim 1 further comprising a plurality of metal contacts on the four gates.

4. The multi-transistor layout of claim 1 further comprising a plurality of metal contacts on the four sources.

5. The multi-transistor layout of claim 1 wherein the length of each of the four gates is greater than the length of the respective sides of the common drain.

* * * * *